(12) United States Patent
Yazaki et al.

(10) Patent No.: US 6,768,410 B1
(45) Date of Patent: Jul. 27, 2004

(54) LAMINATED BALUN TRANSFORMER

(75) Inventors: Hirokazu Yazaki, Shiga-ken (JP); Atsushi Toujo, Shiga-ken (JP)

(73) Assignee: Murata Manufacturing Co., LTD, Kyoto (JP)

( * ) Notice: Subject to any disclaimer, the term of this patent is extended or adjusted under 35 U.S.C. 154(b) by 0 days.

(21) Appl. No.: 10/311,752

(22) PCT Filed: Apr. 17, 2002

(86) PCT No.: PCT/JP02/03828
§ 371 (c)(1), (2), (4) Date: Jun. 11, 2003

(87) PCT Pub. No.: WO02/086920
PCT Pub. Date: Oct. 31, 2002

(30) Foreign Application Priority Data

Apr. 19, 2001 (JP) ........................................ 2001-121718
Apr. 3, 2002 (JP) ........................................ 2002-100719

(51) Int. Cl.[7] ................................................. H01F 5/00
(52) U.S. Cl. ........................ 336/200; 336/223; 336/232
(58) Field of Search ................................. 336/200, 223, 336/232

(56) References Cited

U.S. PATENT DOCUMENTS 5,497,137 A * 3/1996 Fujiki .......................... 336/200
6,388,551 B2 * 5/2002 Morikawa ................... 336/223
6,483,415 B1 * 11/2002 Tang ........................... 336/200

FOREIGN PATENT DOCUMENTS

| JP | 50-151409 | 12/1975 | |
| JP | 62-049212 | 3/1987 | |
| JP | 07-176918 | 7/1995 | |
| JP | 07254512 A | * 10/1995 | ........... H01F/17/00 |
| JP | 08-191016 | 7/1996 | |
| JP | 09-260145 | 10/1997 | |
| JP | 11-214943 | 8/1999 | |
| JP | 2000-188218 | 7/2000 | |

* cited by examiner

*Primary Examiner*—Anh Mai
(74) *Attorney, Agent, or Firm*—Keating & Bennett, LLP (57) ABSTRACT

A laminated balun transformer includes first line elements which are connected in series through a relay terminal, to constitute an unbalanced transmission line. Other line elements each constitute a balanced transmission lines. Strip lines are electromagnetically coupled to constitute a coupler. Similarly, other line elements are electromagnetically coupled to constitute a coupler. A ground terminal is connected to the balanced transmission lines, which are constituted by a pair of the line elements. Meanwhile, a shield terminal is connected to leading portions of shield electrodes. These two terminals are electrically independent of each other.

21 Claims, 6 Drawing Sheets

LAMINATED BALUN TRANSFORMER

BACKGROUND OF THE INVENTION

1. Field of the Invention

The present invention relates to laminated balun transformers, and more particularly, to a laminated balun transformer for use as a balanced-to-unbalanced signal converter, a phase transformer, or other suitable device for an IC for a radio communication apparatus.

2. Description of the Related Art

A balun transformer is used to convert, for example, a balanced signal from a balanced transmission line into an unbalanced signal for an unbalanced transmission line or to convert an unbalanced signal from an unbalanced transmission line into a balanced signal for a balanced transmission line. The term "balun" is an abbreviation of "BALanced-UNbalanced".

A balanced transmission line has a pair of signal lines, through which a signal (a balanced signal) propagates as a potential difference therebetween. In a balanced transmission line, the two signal lines are equally affected by external noise, thereby canceling out the external noise. Thus, the balanced transmission line has an advantage in that it is less susceptible to the influence of external noise. In addition, since the internal circuit of an analog IC includes a differential amplifier, the input/output terminals for a signal for the analog IC are, in many cases, of a balanced type that outputs or inputs a signal as a potential difference between the two terminals.

In contrast, in an unbalanced transmission line, a signal (unbalanced signal) propagates as a potential of a single signal line relative to a ground potential (zero potential). Examples of an unbalanced transmission line include a coaxial line and a microstrip line disposed on a substrate.

Figure 7:
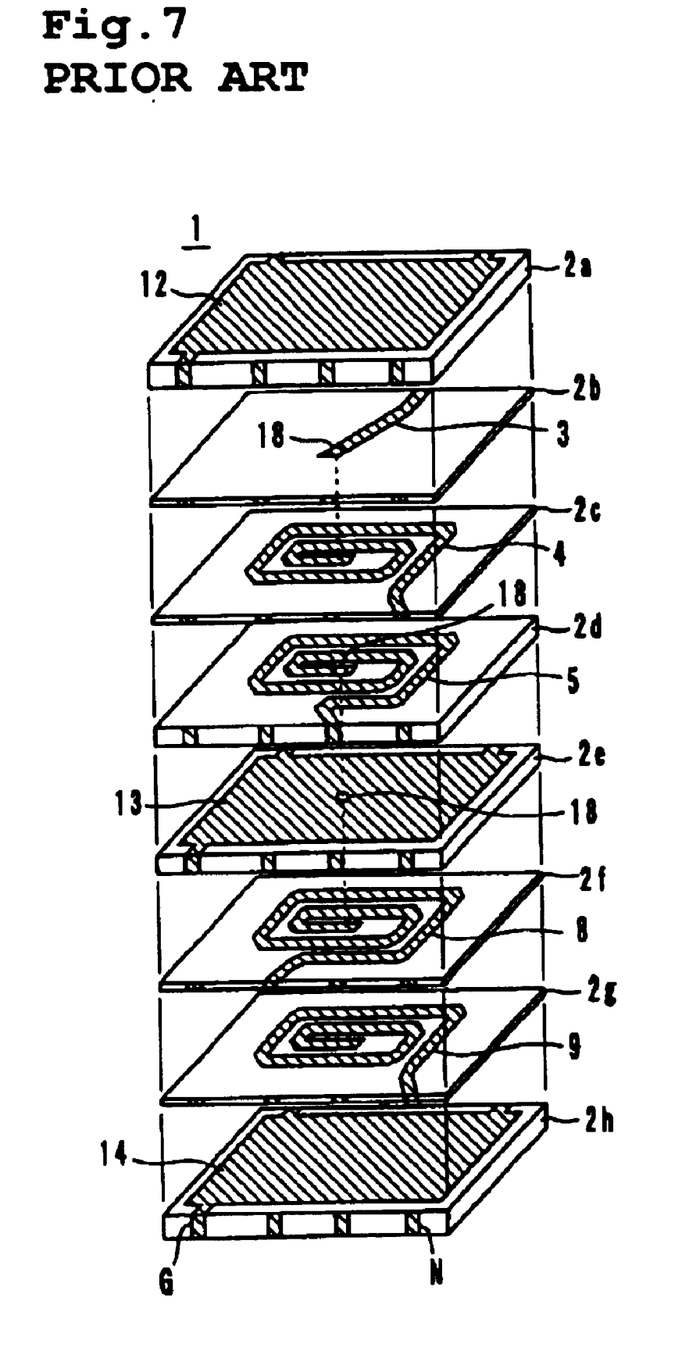
FIG. 7 is an exploded perspective view showing a conventional laminated balun transformer.

Conventionally, a laminated balun transformer 1 shown in FIG. 7 has been proposed as a balanced-to-unbalanced converter for a transmission line in a radio-frequency circuit.

The balun transformer 1 includes dielectric sheets 2a to 2h. On the surface of the dielectric sheet 2b, a lead electrode 3 is provided. On the dielectric sheets 2c, 2d, 2f, and 2g, ¼ wavelength strip lines 4, 5, 8, and 9 are provided, respectively. On the surfaces of the dielectric sheets 2a, 2e, and 2h, shield electrodes 12, 13, and 14 are provided, respectively.

The strip lines 4 and 9 are electrically connected in series through a relay terminal N, which is provided on an outer surface, to constitute an unbalanced transmission line. The strip lines 5 and 8, on the other hand, each constitute a balanced transmission line.

The strip line 5 is arranged so as to oppose the strip line 4 with the sheet 2c being interposed therebetween. Thus, the strip lines 4 and 5 are electromagnetically coupled to constitute a coupler. The strip line 9 is arranged so as to oppose the strip line 8 with the sheet 2f interposed therebetween. Thus, the strip lines 8 and 9 are electromagnetically coupled to constitute a coupler. The strip lines 5 and 9 are connected in series through a via hole 18 that is formed in the sheets 2d and 2e.

Meanwhile, in some cases, a balun transformer 1 for use in an mobile communication apparatus, such as a portable telephone, or a wireless LAN are required to amplify a balanced signal by applying a bias to only the balanced transmission lines.

In the balun transformer 1 described above, however, one end of the strip line 5 and one end of the strip line 8, which constitute the balanced transmission lines, are electrically connected to a shield terminal G via a shield electrode 13. Thus, it is impossible to apply a bias voltage to only the balanced transmission lines. In other words, the balun transformer 1 having such a configuration has a problem in that a balanced signal cannot be amplified.

SUMMARY OF THE INVENTION

In order to overcome the problems described above, preferred embodiments of the present invention provide a laminated balun transformer that allows a bias voltage to be applied to only transmission lines to amplify a balanced signal.

According to a preferred embodiment of the present invention, a laminated balun transformer includes a stack in which, at least, a pair of balanced transmission lines, an unbalanced transmission line that is electromagnetically coupled with the pair of balanced transmission lines, a shield electrode that opposes at least one of the balanced transmission lines and the unbalanced transmission line, and a plurality of dielectric layers are stacked, a ground terminal that is provided on a surface of the stack and that is electrically connected to the balanced transmission lines, and a shield terminal that is provided on a surface of the stack and that is electrically connected to the shield electrode.

One of the unique features of the laminated balun transformer is that the ground terminal and the shield terminal are electrically independent of each other.

With this arrangement, since the ground terminal that is electrically independent of the shield terminal is provided, for example, a bias voltage can be applied to only the ground terminal.

In addition, another preferred embodiment of the present invention provides a laminated balun transformer that includes a pair of balanced transmission lines, an unbalanced transmission line that is electromagnetically coupled with the pair of balanced transmission lines, an unbalanced signal terminal that is electrically connected to one end of the unbalanced transmission line, two balanced signal terminals, each terminal being electrically connected to one end of one corresponding balanced transmission line, a common bias terminal that is electrically connected to the other ends of the balanced transmission lines, and a bias capacitor that is electrically connected between the common bias terminal and ground.

In addition, another preferred embodiment provides a laminated balun transformer that includes a stack in which, at least, a pair of balanced transmission lines, an unbalanced transmission line that is electromagnetically coupled with the pair of balanced transmission lines, a shield electrode that opposes at least one of the balanced transmission lines and the unbalanced transmission line, a pair of bias-capacitor patterns, and a plurality of dielectric layers are stacked, a common bias terminal that is provided on a surface of the stack and that is electrically connected to the balanced transmission lines and one capacitor pattern of the bias-capacitor patterns; and a shield terminal that is provided on a surface of the stack and that is electrically connected to the shield electrode and the other capacitor pattern.

One of the unique features of this laminated balun transformer is that the common bias terminal and the shield terminal are electrically independent of each other.

With the unique arrangements described above, when a bias electrode is applied to the common bias terminal, the bias electrode is applied to only the balanced transmission lines via the bias capacitor, thus allowing for stable amplification of a balanced signal.

Other features, elements, characteristics and advantages of the present invention will become more apparent from the following detailed description of preferred embodiments thereof with reference to the attached drawings.

DETAILED DESCRIPTION OF PREFERRED EMBODIMENTS

A laminated balun transformer of the present invention will be described below in conjunction with preferred embodiments thereof.

In each preferred embodiment, similar elements and similar portions are denoted with the same reference numerals in the drawings.

First Preferred Embodiment, FIGS. 1 to 4

Figure 1:
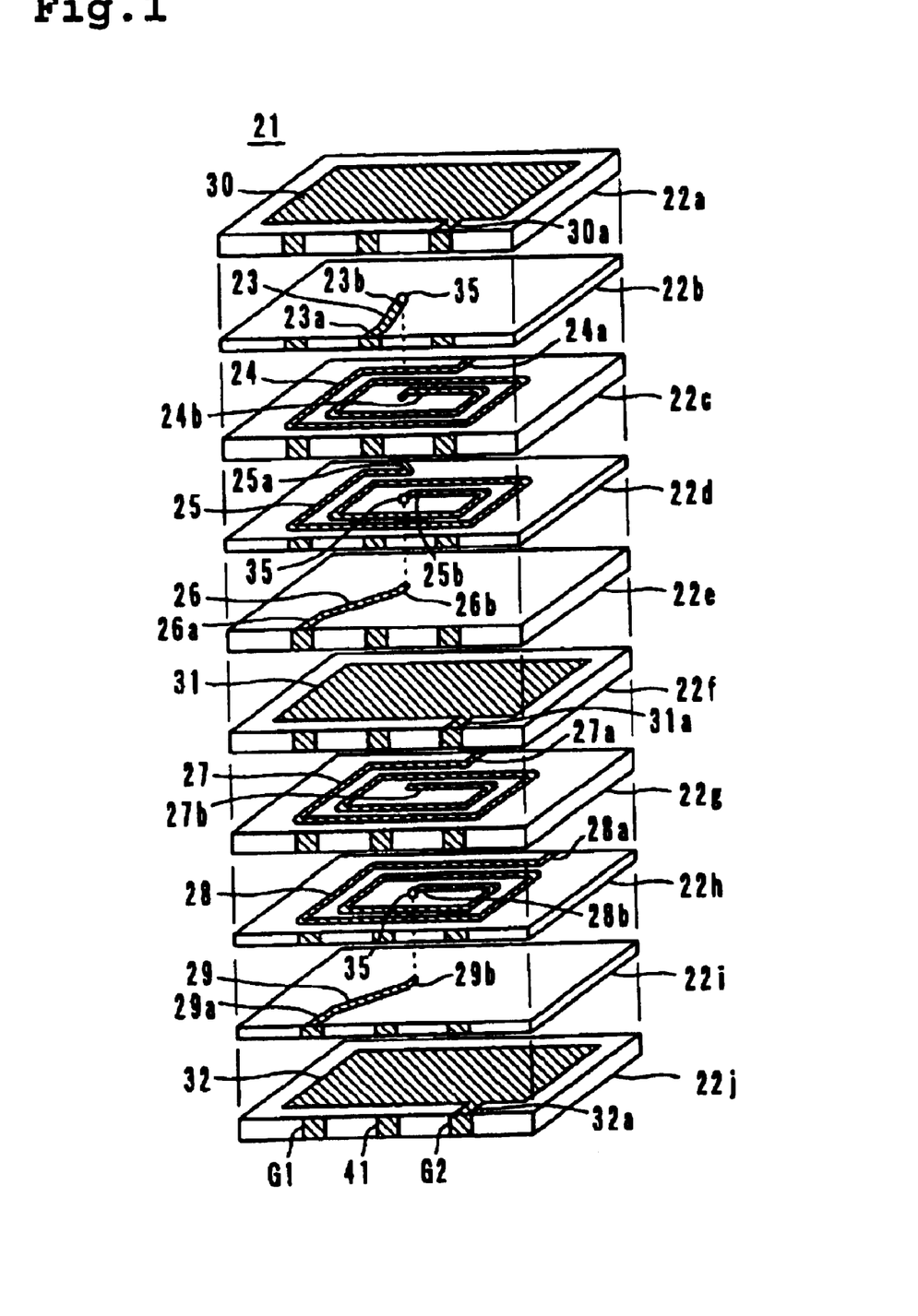
FIG. 1 is an exploded perspective view of a laminated balun transformer according to a first preferred embodiment of the present invention.

As shown in FIG. 1, a laminated balun transformer 21 includes dielectric sheets 22a to 22j. on the surfaces of the dielectric sheets 22b, 22e, and 22i, lead electrodes 23, 26, and 29 are provided, respectively. On the surfaces of the dielectric sheets 22c, 22d, 22g, and 22h, line elements 24, 25, 27, and 28, each having an electrical length corresponding to a ¼ wavelength, are provided, respectively. On the surfaces of the dielectric sheets 22a, 22f, and 22j, shield electrodes 30, 31, and 32 are provided, respectively.

As a material for the dielectric sheets 22a to 22j, a resin, such as epoxy, or a dielectric ceramic is preferably used. In the first preferred embodiment, dielectric ceramic powder is preferably used as a material for the dielectric sheets 22a to 22j, and is mixed and kneaded with a binder or other suitable material. The resulting mixture is then formed into ceramic green sheets. The thicknesses of the dielectric sheets 22a to 22j are set to predetermined values.

The lead electrode 23 has one end 23a that is exposed at the middle of the proximal edge of the dielectric sheet 22b, and the other end 23b of the lead electrode 23 is located at the approximate center of the dielectric sheet 22b. The line element 24 preferably has a spiral pattern configuration. One end 24a of the line element 24 is exposed at the middle of the distal edge of the sheet 22c, and the other end 24b thereof is located at the center of the dielectric sheet 22c. The end 24b of the line element 24 is electrically connected to the end 23b of the lead electrode 23 through a via hole 35 provided in the dielectric sheet 22b.

The line element 25 preferably has a spiral pattern configuration. One end 25a of the line element 25 is exposed at the left side of the distal edge of the sheet 22d, and the other end 25b thereof is located at the approximate center of the dielectric sheet 22d. One end 26a of the lead electrode 26 is exposed at the left side of the proximal edge of the sheet 22e, and the other end 26b thereof is located at the approximate center of the dielectric sheet 22e. The end 26b of the lead electrode 26 is electrically connected to the end 25b of the line element 25 through a via hole 35 provided in the sheet 22d.

The line element 27 preferably has a spiral pattern configuration. One end 27a of the line element 27 is exposed at the middle of the distal edge of the sheet 22g, and the other end 27b thereof is located at the approximate center of the sheet 22g.

The line element 28 has the shape of a spiral pattern. One end 28a of the line element 28 is exposed at the right side of the distal edge of the sheet 22h, and the other end 28b thereof is located at the approximate center of the dielectric sheet 22h. One end 29a of the lead electrode 29 is exposed at the left side of the proximal edge of the sheet 22i, and the other end 29b thereof is located at the approximate center of the sheet 22i. The end 29b of the lead electrode 29 is electrically connected to the end 28b of the line element 28 through a via hole 35 provided in the sheet 22h.

The shield electrodes 30, 31, and 32 are provided on substantially the entire surfaces of the sheets 22a, 22f, and 22j, respectively. Lead portions 30a, 31a, and 32a therefor are exposed at the right side of the proximal edge of the dielectric sheets 22a, 22f, and 22j, respectively. When the characteristics of the balun transformer 21 are taken into account, the shield electrodes 30, 31, and 32 are preferably arranged to be separated by a predetermined distance from the line elements 24, 25, 27 and 28. The lead electrodes 23, 26, and 29, the line elements 24, 25, 27, and 28, and the shield electrodes 30, 31, and 32 are formed by sputtering, deposition, printing, or other suitable process, and include a material, such as Ag—Pd, Ag, Pd, or Cu, or other suitable material.

Figure 2:
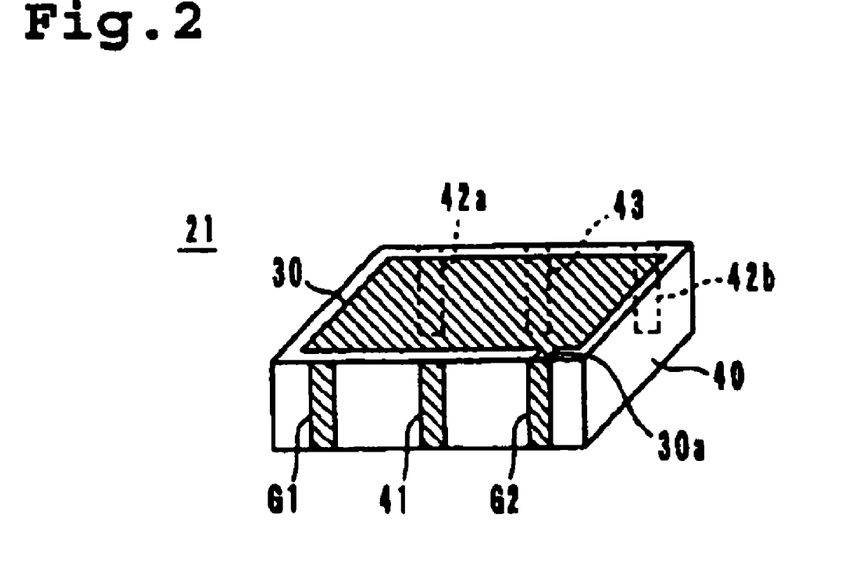
FIG. 2 is a perspective view showing the outer appearance of the balun transformer shown in FIG. 1.

The dielectric sheets 22a to 22j are stacked and integrally fired to provide a stack 40, as shown in FIG. 2. A ground terminal G1, an unbalanced signal terminal 41, and a shield terminal G2 are formed on the proximal side surface of the stack 40. Balanced signal terminals 42a and 42b and a relay terminal 43 are formed on the distal side surface of the stack 40. The terminals 41 to 43, G1, and G2 are formed by sputtering, deposition, coating, or other suitable process, and include a material, such as Ag—Pd, Ag, Pd, Cu, or a Cu alloy, or other suitable material.

Figure 3:
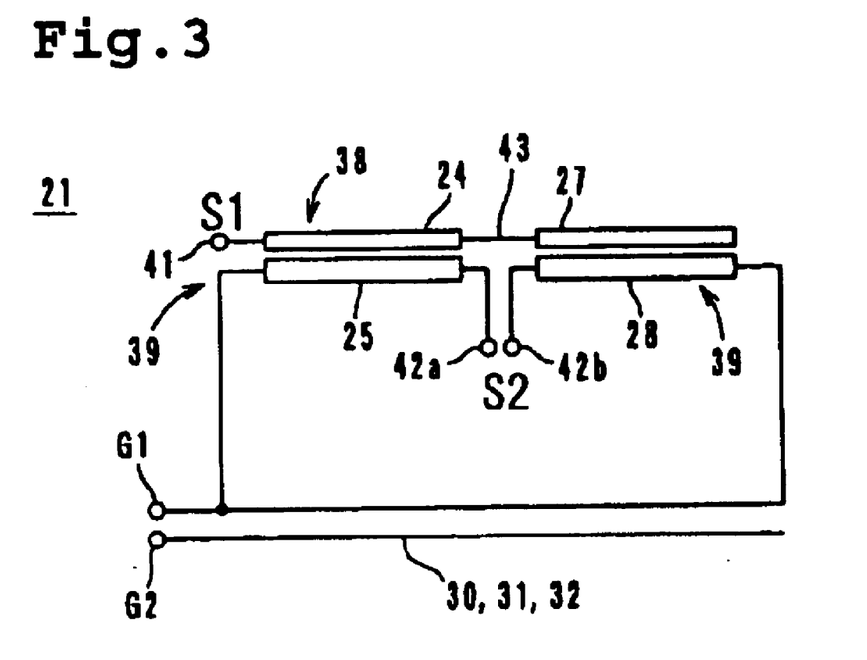
FIG. 3 is an electrical equivalent circuit diagram of the balun transformer shown in FIG. 2.

The unbalanced signal terminal 41 is electrically connected to the end 23a of the lead electrode 23, the balanced terminal 42a is electrically connected to the end 25a of the line element 25, the balanced signal terminal 42b is electrically connected to the end 28a of the line element 28, and the relay terminal 43 is electrically connected to the ends 24a and 27a of the line elements 24 and 27. The ground terminal G1 is electrically connected to the ends 26a and 29a of the lead electrodes 26 and 29, and the shield terminal G2 is electrically connected to the lead portions 30a to 32a of the shield electrodes 30 to 32. FIG. 3 is an electrical equivalent circuit diagram of the laminated balun transformer 21.

In the balun transformer 21 having the above-described configuration, the line elements 24 and 25 are arranged between the shield electrodes 30 and 31, and have a strip line structure. The line elements 27 and 28 are also arranged between the shield electrodes 31 and 32, and have a strip line structure. The line elements 24 and 27 are connected in series through the relay terminal 43, to constitute an unbalanced transmission line 38, which is an impedance element. The line elements 25 and 28 each constitute a balanced transmission line 39, which is an impedance element.

The line elements 24 and 25 are arranged so as to oppose each other with the dielectric sheet 22c interposed therebetween, and the line elements 27 and 28 are arranged so as to oppose each other with the dielectric sheet 22g interposed therebetween. Thus, the spiral pattern of the line element 24 and the spiral pattern of the line element substantially overlap each other in plan view, and the opposing portions are electromagnetically coupled (line coupling) to constitute a coupler. Similarly, the spiral pattern of the line element 27 and the spiral pattern of the line element 28 substantially overlap each other in plan view, and the opposing portions are electromagnetically coupled (line coupling) to constitute a coupler. While one end (specifically, the end 27a of the line element 27) of the unbalanced transmission line 38 is free, it may be connected to ground.

For adjusting electrical characteristics of the balun transformer 21, the thicknesses of the dielectric sheets 22c and 22g and the line width of the line elements 24, 25, 27, and 28 are changed to adjust the electromagnetic coupling between the line elements 24 and 25 or the electromagnetic coupling between the line elements 27 and 28.

Since the ground terminal G1, which is electrically connected to the balanced transmission lines 39, is electrically independent of the shield terminal G2, the ground terminal G1 can be used not only as a ground terminal but also as a bias terminal or other terminal. For example, the balun transformer 21 may be incorporated into a portable telephone or a mobile communication apparatus, or other suitable apparatus. In such a case, a balanced signal that propagates through the balanced transmission lines 39 can be amplified by applying a bias voltage to the ground terminal G1, which has conventionally been connected to ground.

Figure 4:
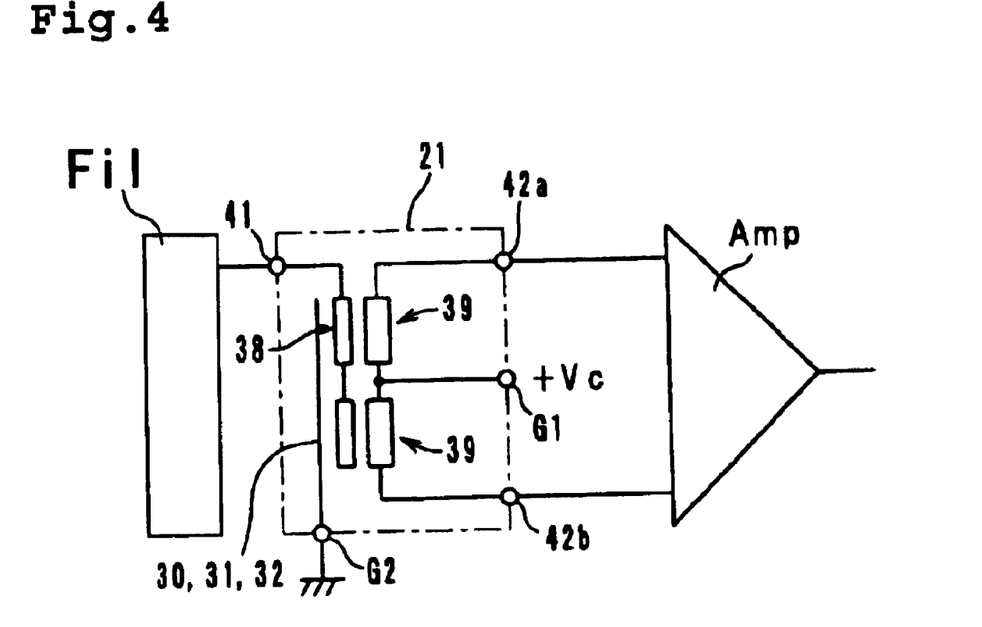
FIG. 4 is an electrical circuit diagram for illustrating effects of the balun transformer shown in FIG. 2.

FIG. 4 is an electrical circuit diagram showing a major portion of the balun transformer 21 that is incorporated in a mobile communication apparatus. The balun transformer 21 is connected between a filter circuit Fil and a low-noise amplifier Amp. An unbalanced signal S1 that is input from the filter circuit Fil is converted by the balun transformer 21 into a balanced signal S2, which is then output from the balanced signal terminals 42a and 42b to the low-noise amplifier Amp.

In this case, a bias voltage is applied to the ground terminal G1 of the balun transformer 21. This causes the bias voltage to be applied to the low-noise amplifier Amp, as a power-supply voltage for the low-noise amplifier Amp, through the balanced transmission lines 39. As a result, the electrical circuit is simplified, which allows for miniaturization of the mobile communication apparatus.

Additionally, the balun transformer 21 has a shielding effect since the shield electrode 30 is disposed on the upper surface thereof. Further, although the shield electrode 30 is exposed at the upper surface thereof, the shield electrode 30 may be integrally covered by another dielectric sheet.

A case in which the balun transformer 21 is included as a balanced-to-unbalanced signal converter will now be described with reference to FIG. 3. When an unbalanced signal S1 is input to the unbalanced signal terminal 41, the unbalanced signal S1 propagates through the unbalanced transmission line 38 (the lead electrode 23—line element 24—relay terminal 43—line element 27). Thus, the line element 24 is electromagnetically coupled with the line element 25 and the line element 27 is electromagnetically coupled with the line element 28, thereby converting the unbalanced signal S1 into a balanced signal S2. The balanced signal S2 is then output from the balanced signal terminals 42a and 42b. Conversely, when a balanced signal S2 is input to the balanced signal terminals 42a and 42b, the balanced signal S2 propagates through the balanced transmission lines 39, and is converted by the unbalanced transmission line 38 into an unbalanced signal S1, which is then output from the unbalanced signal terminal 41.

Figure 5:
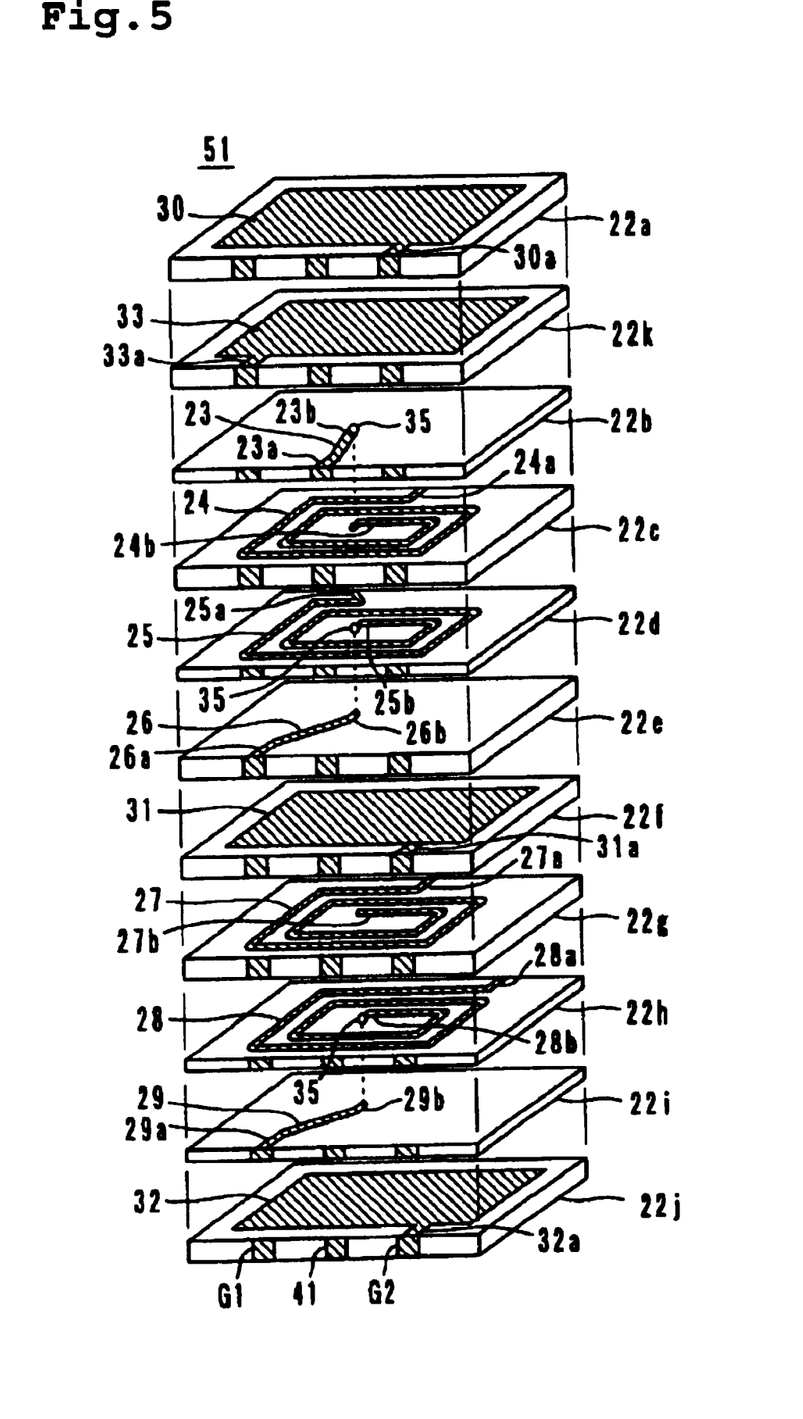
FIG. 5 is an exploded perspective view of a laminated balun transformer according to a second preferred embodiment of the present invention.
Figure 6:
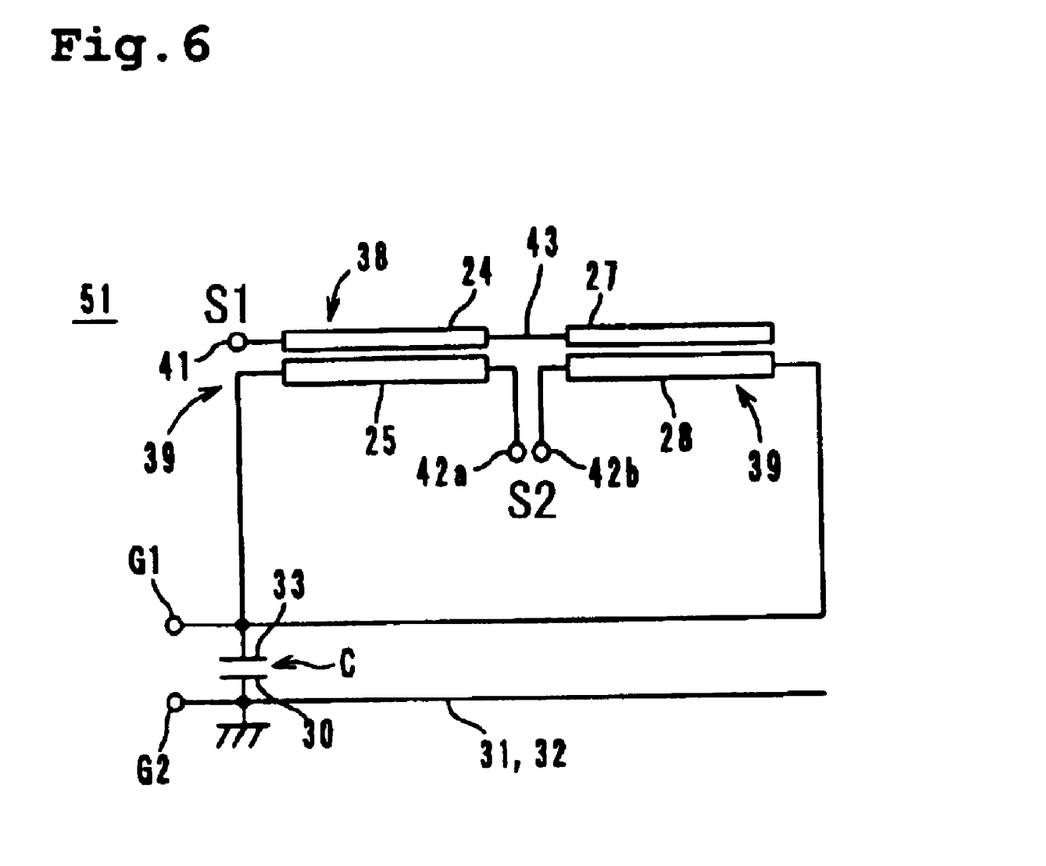
FIG. 6 is an electrical equivalent circuit diagram of the balun transformer shown in FIG. 5.

Second Preferred Embodiment, FIGS. 5 to 6

A balun transformer according to a second preferred embodiment has a configuration in which a dielectric sheet 22k, which has a bias-capacitor pattern 33 on a surface thereof, is inserted between the dielectric sheets 22a and 22b of the balun transformer 21 of the first preferred embodiment. Thus, as shown in FIG. 5, the dielectric sheet 22k is provided between the dielectric sheets 22a and 22b, and the bias-capacitor pattern 33 is disposed at a surface of the dielectric sheet 22k. A lead portion 33a of the bias-capacitor pattern 33 is exposed at the left side of the proximal edge of the sheet 22k. The bias-capacitor pattern 33 and the shield capacitor-pattern 30 define a bias capacitor C of, for example, about 30 pF. Thus, the shield capacitor-pattern 30 also defines a bias-capacitor pattern. The shapes of the capacitor patterns 30 and 33 are arbitrary, but it is preferable that the capacitor pattern 30 is arranged to have a large area since it must provide a shielding effect.

The dielectric sheets 22a to 22k are stacked and integrally fired to provide a stack, as shown in FIG. 2. A common bias terminal G1, an unbalanced signal terminal 41, and a shield terminal G2 are disposed on the proximal side surface of the stack. Balanced signal terminals 42a and 42b and a relay terminal 43 are disposed on the distal side surface of the stack.

FIG. 6 is an electrical equivalent circuit diagram of the laminated balun transformer 51. The common bias terminal G1 is connected to one end of each of the balanced transmission lines 39 via the bias capacitor C. This arrangement can provide the laminated balun transformer 51 into which the bias capacitor C is incorporated.

The characteristics of the balun transformer 21 of the first preferred embodiment can deteriorate in some cases, when the ground terminal G1 is used as a bias terminal. The balun transformer of the second preferred embodiment, however, can prevent the characteristic deterioration, since it has the bias capacitor C between the common bias terminal G1 and the shield terminal (ground) G2.

Other Preferred Embodiments

The laminated balun transformer of the present invention is not limited to the above-described preferred embodiments, and thus can be changed within the sprit and scope of the present invention.

For example, the line elements 24, 25, 27, 28 may have any shape, and thus may have a spiral, curved, or straight shape, or other suitable shape. In addition, the line elements do not necessary have to be set to a length of ¼ wavelength, and also the line widths of all the line elements also do not have to be the same.

Additionally, the structure of the line elements is not limited to the strip line structure arranged between two shield electrodes, and may be a so-called "microstrip line structure" in which line elements are arranged on the obverse surface of a dielectric substrate (on the reverse surface, a shield electrode is provided).

In the laminated balun transformers of various preferred embodiments described above, the coupler constituted by the line elements 24 and 25 and the coupler constituted by the line elements 27 and 28 are vertically arranged in the stack in which the dielectric sheets 22a to 22k are stacked. However, the couplers may be arranged side by side on a dielectric sheet.

Furthermore, the number of couplers constituted by electromagnetically-coupled line elements is not limited to two, and thus may be three or more. For example, the balun transformer may be a so-called "dual balun transformer" having a pair of balanced transmission lines and two unbalanced transmission lines that are electromagnetically coupled with the balanced transmission lines. Alternatively, the balun transformer may include one unbalanced transmission line and two pairs of balanced transmission lines that are electromagnetically coupled with the unbalanced transmission line.

In addition, the electromagnetic coupling between the balanced transmission line and the unbalanced transmission line is not limited to line coupling, and may also be coil coupling. Further, the description in the various preferred embodiments has been given for a case in which a bias voltage is applied to only the balanced transmission lines 39. When, however, one end (the end 27a of the line element 27) of the unbalanced transmission line 38 is connected to ground, a ground terminal that is electrically connected to the unbalanced transmission line 38 may be additionally provided such that a bias voltage is applied to the ground terminal.

While preferred embodiments have been described in the case of a single product by way of example, in the case of mass production, a motherboard having a plurality of balun transformers can be fabricated and cut into products having a predetermined size. Further, in preferred embodiments described above, after the dielectric sheets on which conductors have been formed are stacked, the dielectric sheets are integrally fired. However, the present invention is not necessarily limited thereto. Thus, sheets that have been fired in advance may be used. In addition, the balun transformer may be fabricated by the following method. A dielectric layer is preferably formed by applying a dielectric material in paste form by printing or other suitable method, and a conductive material in paste form is applied to a surface of the dielectric layer to form a conductor. Next, a dielectric material in paste form is applied onto the conductor. Overlaying pastes sequentially in that manner can provide a balun transformer having a stacked structure.

As described above, according to preferred embodiments of the present invention, since the ground terminal that is electrically independent of the shield terminal is provided, the ground terminal can also be used as, for example, a bias terminal. Thus, applying a bias voltage to only the ground terminal that is connected to the balanced transmission lines allows for the amplification of a balanced signal propagating through the balanced transmission lines. In addition, incorporating the bias capacitor into the balun transformer allows a bias voltage to be applied via the bias capacitor, thereby achieving stable amplification of the balanced signal.

As described above, the laminated balun transformer of preferred embodiments of the present invention can be advantageously used as a balanced-to-unbalanced signal converter, phase shifter, or other device for an IC for a wireless communication apparatus While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. A laminated balun transformer comprising:
   a stack in which, at least a pair of balanced transmission lines, an unbalanced transmission line that is electromagnetically coupled with the pair of balanced transmission lines, a shield electrode that opposes at least one of the balanced transmission lines and the unbalanced transmission line, and a plurality of dielectric layers are stacked;
   a ground terminal that is provided on a surface of the stack and that is electrically connected to the balanced transmission lines; and
   a shield terminal that is provided on a surface of the stack and that is electrically connected to the shield electrode;
   wherein the ground terminal and the shield terminal are electrically independent of each other.

2. The laminated balun transformer according to claim 1, wherein the stack includes a plurality of dielectric sheets having lead electrodes and line elements disposed thereon.

3. The laminated balun transformer according to claim 2, wherein each of the line elements has an electrical length corresponding to a ¼ wavelength.

4. The laminated balun transformer according to claim 2, wherein shield electrodes are provided on the plurality of dielectric sheets.

5. The laminated balun transformer according to claim 2, wherein the lead electrodes have a spiral configuration.

6. The laminated balun transformer according to claim 2, wherein each of the lead electrodes are electrically connected to another of the lead electrodes through via holes formed in the stack.

7. A laminated balun transformer comprising:
   a pair of balanced transmission lines;
   an unbalanced transmission line that is electromagnetically coupled with the pair of balanced transmission lines;
   an unbalanced signal terminal that is electrically connected to one end of the unbalanced transmission line;
   two balanced signal terminals, each of the two balanced signal terminals being electrically connected to one end of a corresponding one of the pair of balanced transmission lines;
   a common bias terminal that is electrically connected to the other ends of the pair of balanced transmission lines; and
   a bias capacitor that is electrically connected between the common bias terminal and ground.

8. The laminated balun transformer according to claim 7, further comprising a stack including the pair of balanced transmission lines, the unbalanced transmission line, and a shield electrode that opposes at least one of the pair of balanced transmission lines and the unbalanced transmission line.

9. The laminated balun transformer according to claim 8, wherein the stack includes a plurality of dielectric sheets having lead electrodes and line elements disposed thereon.

10. The laminated balun transformer according to claim 9, wherein each of the line elements has an electrical length corresponding to a ¼ wavelength.

11. The laminated balun transformer according to claim 10, wherein shield electrodes are provided on the plurality of dielectric sheets.

12. The laminated balun transformer according to claim 10, wherein the lead electrodes have a spiral configuration.

13. The laminated balun transformer according to claim 10, wherein each of the lead electrodes are electrically connected to another of the lead electrodes through via holes formed in the stack.

14. The laminated balun transformer according to claim 8, wherein the common bias terminal and the shield electrode are electrically independent of each other.

15. The laminated balun transformer according to claim 8, further comprising a ground terminal that is provided on a surface of the stack and electrically connected to the pair of balanced transmission lines, wherein the ground terminal and the shield terminal are electrically independent of each other.

16. A laminated balun transformer comprising:
   a stack in which, at least a pair of balanced transmission lines, an unbalanced transmission line that is electromagnetically coupled with the pair of balanced transmission lines, a shield electrode that opposes at least one of the pair of balanced transmission lines and the unbalanced transmission line, a pair of bias-capacitor patterns, and a plurality of dielectric layers are stacked;
   a common bias terminal that is provided on a surface of the stack and that is electrically connected to the balanced transmission lines and one of the pair of bias-capacitor patterns; and
   a shield terminal that is provided on a surface of the stack and that is electrically connected to the shield electrode and the other of the pair of bias-capacitor patterns;
   wherein the common bias terminal and the shield terminal are electrically independent of each other.

17. The laminated balun transformer according to claim 16, wherein the stack includes a plurality of dielectric sheets having lead electrodes and line elements disposed thereon.

18. The laminated balun transformer according to claim 17, wherein each of the line elements has an electrical length corresponding to a ¼ wavelength.

19. The laminated balun transformer according to claim 17, wherein shield electrodes are provided on the plurality of dielectric sheets.

20. The laminated balun transformer according to claim 17, wherein the lead electrodes have a spiral configuration.

21. The laminated balun transformer according to claim 17, wherein each of the lead electrodes are electrically connected to another of the lead electrodes through via holes formed in the stack.

* * * * *